US008772079B2

(12) United States Patent
Krause et al.

(10) Patent No.: US 8,772,079 B2
(45) Date of Patent: Jul. 8, 2014

(54) BACKSIDE CONTACTING ON THIN LAYER PHOTOVOLTAIC CELLS

(75) Inventors: Rainer Krause, Kostheim (DE); Gerd Pfeiffer, Poughquag, NY (US); Thorsten Muehge, Budenheim (DE); Hans-Juergen Eickelmann, Nieder-Hilbersheim (DE); Michael Haag, Rodenbach (DE); Markus Schmidt, Seibersbach (DE)

(73) Assignee: International Business Machines Corporation, Armonk, NY (US)

( * ) Notice: Subject to any disclaimer, the term of this patent is extended or adjusted under 35 U.S.C. 154(b) by 785 days.

(21) Appl. No.: 12/594,146

(22) PCT Filed: Apr. 8, 2008

(86) PCT No.: PCT/EP2008/054205
§ 371 (c)(1),
(2), (4) Date: Feb. 12, 2010

(87) PCT Pub. No.: WO2008/141863
PCT Pub. Date: Nov. 27, 2008

(65) Prior Publication Data
US 2010/0132760 A1    Jun. 3, 2010

(30) Foreign Application Priority Data

May 24, 2007    (EP) ..................................... 07108814

(51) Int. Cl.
*H01L 31/18*   (2006.01)
*H01L 31/0224*   (2006.01)

(52) U.S. Cl.
CPC .............................. *H01L 31/022441* (2013.01)
USPC ............................................. 438/98; 136/256

(58) Field of Classification Search
CPC ................................................ H01L 31/022441
USPC ............................................. 438/98; 136/256
See application file for complete search history.

(56) References Cited

U.S. PATENT DOCUMENTS 3,151,379 A * 10/1964 Escoffery ........................ 438/80
3,617,820 A * 11/1971 Herzog ............................. 257/86
(Continued)

FOREIGN PATENT DOCUMENTS

GB    2367788 A  *  4/2002  ............ H01L 21/306
JP    53-055994 A      5/1978
(Continued)

OTHER PUBLICATIONS semiconductorTODAY, Silicon shortage opens window for CIGS PVs, Compounds & Advanced Silicon, vol. 1, Issue 4, Oct./Nov. 2006, pp. 1-4.*

(Continued)

*Primary Examiner* — Earl Taylor
(74) *Attorney, Agent, or Firm* — IP Authority, LLC; Ramraj Soundararajan; William C. McBeth (57) ABSTRACT

A method of backside contacting of thin layer photovoltaic cells having Si elements as well as thin film cells, like CIGS, is provided, including the following steps:
 providing a p-n-junction including a thin n-doped Si layer and a thin p-doped Si layer bonded on top of said n-doped Si layer;
 bonding said p-n-junction to a glass substrate;
 preparing contact points on said structured thin p-doped Si layer and said thin n-doped Si layer; and
 creating contact pins on said structured thin p-doped Si layer and said thin n-doped Si layer.

4 Claims, 10 Drawing Sheets

(56) References Cited

U.S. PATENT DOCUMENTS

| | | | |
|---|---|---|---|
| 4,001,864 A * | 1/1977 | Gibbons | 136/255 |
| 4,201,622 A * | 5/1980 | Frosch et al. | 117/21 |
| 4,436,557 A * | 3/1984 | Wood et al. | 438/89 |
| 4,493,941 A * | 1/1985 | Yukimoto et al. | 136/255 |
| 4,601,526 A * | 7/1986 | White et al. | 439/66 |
| 4,609,770 A * | 9/1986 | Nishiura et al. | 136/244 |
| 4,645,866 A * | 2/1987 | Nitta | 136/244 |
| 4,879,251 A * | 11/1989 | Kruehler et al. | 438/80 |
| 4,915,743 A * | 4/1990 | Schilling | 136/256 |
| 4,935,067 A * | 6/1990 | Sato et al. | 136/255 |
| 5,045,481 A * | 9/1991 | Schilling et al. | 438/67 |
| 5,266,125 A * | 11/1993 | Rand et al. | 136/244 |
| 5,296,043 A * | 3/1994 | Kawakami et al. | 136/244 |
| 5,738,732 A * | 4/1998 | Nakamura et al. | 136/255 |
| 6,005,185 A | 12/1999 | Tange | |
| 6,194,651 B1 * | 2/2001 | Stark et al. | 136/256 |
| 6,239,354 B1 * | 5/2001 | Wanlass | 136/249 |
| 6,476,314 B2 * | 11/2002 | Bauman et al. | 136/256 |
| 6,518,596 B1 * | 2/2003 | Basore | 257/69 |
| 6,566,277 B1 | 5/2003 | Nakagawa et al. | |
| 6,906,253 B2 * | 6/2005 | Bauman et al. | 136/256 |
| 7,446,051 B2 * | 11/2008 | Young | 438/745 |
| 7,585,781 B2 * | 9/2009 | Young et al. | 438/745 |
| 7,592,201 B2 * | 9/2009 | Young et al. | 438/80 |
| 7,960,206 B2 * | 6/2011 | Young et al. | 438/98 |
| 2002/0166580 A1 * | 11/2002 | Bauman et al. | 136/244 |
| 2003/0029831 A1 * | 2/2003 | Kawase | 216/27 |
| 2004/0261839 A1 * | 12/2004 | Gee et al. | 136/256 |
| 2006/0292821 A1 * | 12/2006 | Young | 438/427 |
| 2007/0007627 A1 * | 1/2007 | Young et al. | 257/623 |
| 2008/0000521 A1 * | 1/2008 | Sivoththaman et al. | 136/254 |
| 2008/0057220 A1 * | 3/2008 | Bachrach et al. | 427/569 |
| 2010/0132760 A1 * | 6/2010 | Krause et al. | 136/244 |

FOREIGN PATENT DOCUMENTS

| | | | | |
|---|---|---|---|---|
| JP | 56-015084 A | | 2/1981 | |
| JP | 56-017081 A | | 2/1981 | |
| JP | 10-189924 A | | 7/1998 | |
| JP | 2000-091603 A | | 3/2000 | |
| JP | 2002-111036 A | | 4/2002 | |
| JP | 2004-095669 A | | 3/2004 | |
| WO | 2005/024920 A1 | | 3/2005 | |
| WO | WO 2005024920 A1 * | | 3/2005 | H01L 21/027 |
| WO | 2005/119782 A1 | | 12/2005 | |
| WO | WO 2005119782 A1 * | | 12/2005 | |

OTHER PUBLICATIONS

Kanellos, Michael, Silicon vs. CIGS: With solar energy, the issue is material, CNET News, Oct. 2006, pp. 1-4.*

Widenborg et al., "Epitaxial Thickening of AIC Poly-Si Seed Layers on Glass by Solid Phase Epitaxy," Journal of Crystal Growth, Mar. 15, 2005, pp. 19-28, V276, N1-2, Elsevier, Amsterdam, NL.

* cited by examiner

BACKSIDE CONTACTING ON THIN LAYER PHOTOVOLTAIC CELLS

CROSS-REFERENCE TO RELATED APPLICATIONS

This Application is a National Phase entry in the United States for International Application PCT/EP2008/054205 filed Apr. 8, 2008, which claims priority benefit to EP 07108814.0, filed May 24, 2007, which is incorporated herein by reference in its entirety.

FIELD OF INVENTION

The present invention relates in general to the formation of ultra thin monocrystalline silicon photovoltaic cells with high efficiency. More particularly, the present invention relates to a method of backside contacting such cells.

BACKGROUND OF THE INVENTION

A solar cell or photovoltaic cell is a semiconductor device consisting of a large-area p-n junction diode, which in the presence of sunlight is capable of generating useable electrical energy. This conversion is called the photovoltaic effect.

Over 95% of all the solar cells produced worldwide are composed of the semiconductor material Silicon (Si). As the second most abundant element in earth's crust, silicon has the advantage, of being available in sufficient quantities, and additionally processing the material does not burden the environment. To produce a solar cell, the semiconductor is contaminated or doped. Doping is the intentional introduction of chemical elements, with which one can obtain a surplus of either positive charge carriers (p-conducting semiconductor layer) or negative charge carriers (n-conducting semiconductor layer) from the semiconductor material. If two differently contaminated semiconductor layers are combined, then a so-called p-n-junction results on the boundary of the layers.

At this junction, an interior electric field is built up which leads to the separation of the charge carriers that are released by light. Through metal contacts, an electric charge can be tapped. If the outer circuit is closed, meaning a consumer is connected, then direct current flows. Silicon cells are approximately 10 cm by 10 cm large (recently also 15 cm by 15 cm). A transparent anti-reflection film protects the cell and decreases reflective loss on the cell surface.

Solar cells have many applications. They are particularly well suited to, and historically used in, situations where electrical power from the grid is unavailable, such as in remote area power systems, handheld calculators, remote radiotelephones and water pumping applications. Solar cells (in the form of modules or solar panels) on building roofs can be connected through an inverter to the electricity grid in a net metering arrangement.

Monocrystalline Si is the base material to achieve the highest efficiency of Si based solar cells. However, monocrystalline Si in the form of wafers, i.e., circular discs in different diameters, typically 150, 200 or 300 mm, is expensive and its availability can be constrained due to high demand from the semiconductor industry.

Monocrystalline silicon, however, is also a limiting factor for the production of high efficient photovoltaic (PV) solar cells. The actual silicon layer thicknesses for PV applications are in the range of 200-330 μm. Efforts to reduce the thickness of the Si layers are typically limited by the ability to handle free standing layers of Si below the thickness range mentioned above.

A major disadvantage of the present PV cells is front side shadowing which has been identified as a main cause for reducing energy yield of grid-connected photovoltaic systems.

SUMMARY OF THE INVENTION

One or more embodiments of the present invention provide a method of backside contacting ultra thin layer photovoltaic cells having silicon elements, including: providing a p-n-junction consisting of a thin n-doped silicon layer and a structured thin p-doped silicon layer bonded on top of the n-doped silicon layer; bonding the p-n-junction to a glass substrate; preparing contact points on the structured thin p-doped silicon layer and the thin n-doped silicon layer; and creating contact pins on the structure thin p-doped silicon layer and the thin n-doped silicon layer.

One or more embodiments of the present invention provide a method of backside contacting ultra thin layer photovoltaic cells having thin film elements, including: bonding a thin film on a glass substrate thus creating an active side of the substrate; creating contact pads on a backside of the glass substrate; and electrically connecting the thin film and the backside.

BRIEF DESCRIPTION OF THE DRAWINGS

The invention will be described in more detail below in connection with the accompanying drawings, in which FIG. 1 schematically shows the process flow describing cell contacting in general.

DETAILED DESCRIPTION OF THE PREFERRED EMBODIMENT

The goal of the method according to the invention described below is to improve the crystalline Si solar technology which has been able to achieve high efficiencies by dramatically lowering the material cost. This can, as a start, be achieved by reducing the thickness of the Si layers involved to the minimum required by the electrical performance parameters of the cells. However, the major content is the elimination of the front side shadowing through backside contacts.

Ultra thin layers, i.e., layers having a thickness of 20 μm and lower, can be realized and perform highly efficient using the light trapping method. The backside must reflect the light and the front side must reflect inside the cell using the conventional light trapping feature.

Process Description

Process Material:

In case of silicon cells, the thin layers are realized through a technology cutting several μm layers of monocrystalline and bonding them onto each other. This is a well known technology which is established in semiconductor manufacturing.

The silicon resistivity is dialed-in at the crystal pulling process via the appropriate amount of dopant added to the melt and the requirements for PV applications are as follows:

| | |
|---|---|
| p-doped: | 15-20 Ω cm |
| n-doped: | 1.5-2 Ω cm |

The bonded silicon p-n-junction is bonded onto a glass substrate using the well known silicon on glass technology (anodic bonding).

By not using wafers, but thin ingots (1 to 2 cm) the efficiency of this process concerning material consumption can be optimized. In case of 1 cm ingots, the usage is as follows:

| | |
|---|---|
| p-ingot: | >4.5k process steps |
| n-ingot: | >4.5k process steps | for the example above.

Therefore, the Si material cost for this process is negligible. This process also prevents the handling of thin Si layer (200-330 μm), which are typically carrying the high risk of damage through handling.

Figure 1:
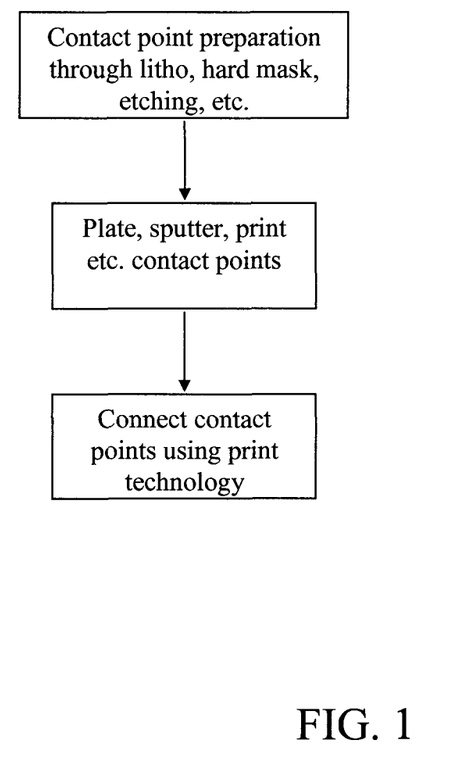

The key process is to realize backside contacts, which is shown in FIG. 1. First, contact points are prepared through lithography, hard mask, etching, etc. for later metal deposition at the right place. Second, contact points are created by plating, sputtering, etc., i.e., metallization at the former prepared spots. Finally, the contact points are connected using the known print technology.

FIG. 2 schematically depicts the process flow for ultra thin Si PV cells including backside contacts using the dual layer transfer approach.

Figure 2A:
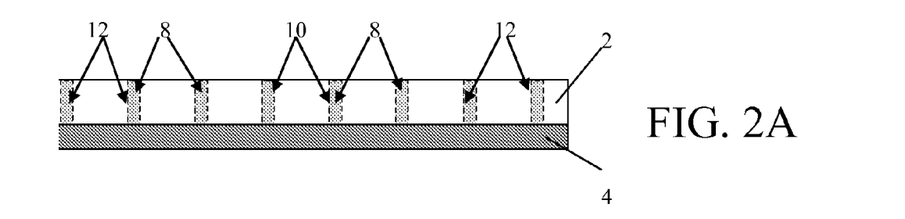
FIGS. 2A to 2E schematically depict the process flow for ultra thin Si PV cells including backside contacts.
Figure 2B:
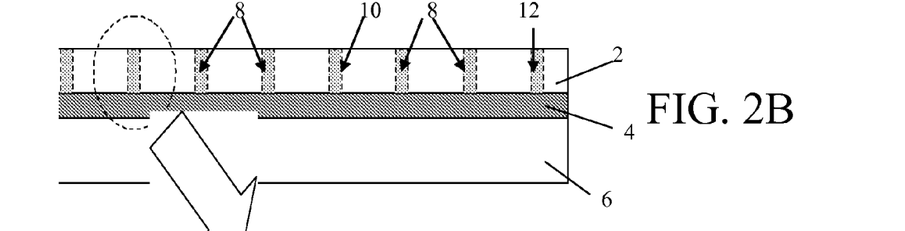

In a first step, a p-layer 2 (about 2-3 cm) is bonded on top of an n-layer 4 (about 2 cm). Subsequently, this dual layer is bonded to a glass substrate 6 by known methods.

Figure 2C:
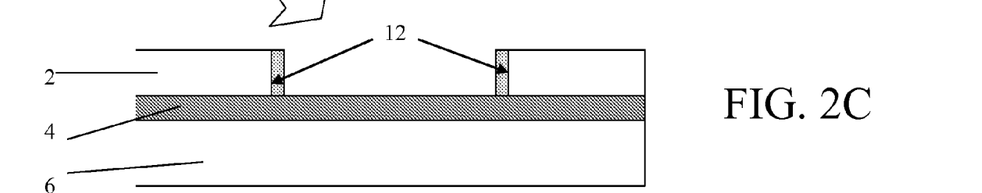
Figure 2D:
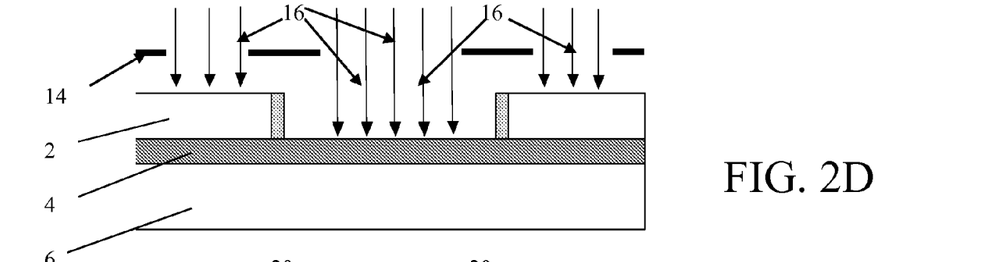
Figure 2E:
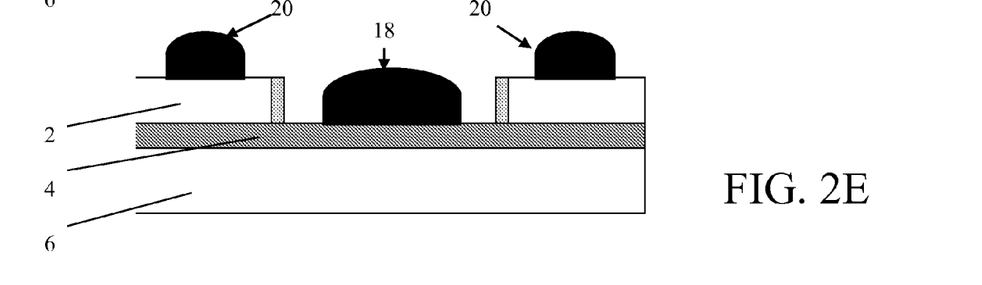

The p-layer is already structured to realize the backside contact holes 8. The walls 10 inside the holes are isolated through oxide annealing 12. Using hard mask or lithography technology (cf. photo resist 14 and radiation 16 in FIG. 2D as an example), the n- as well as the p-contacts 18, 20 are deposited onto the back surface. To secure electrical contact a seed layer, e.g., Al (not shown) is deposited on the silicon. On the seed layers the metallic contact pins 18, 20 are deposited, the n-contacts 18 through the p-holes 8 and the p-contacts 20 on the p-layer 2 directly.

Figure 3:
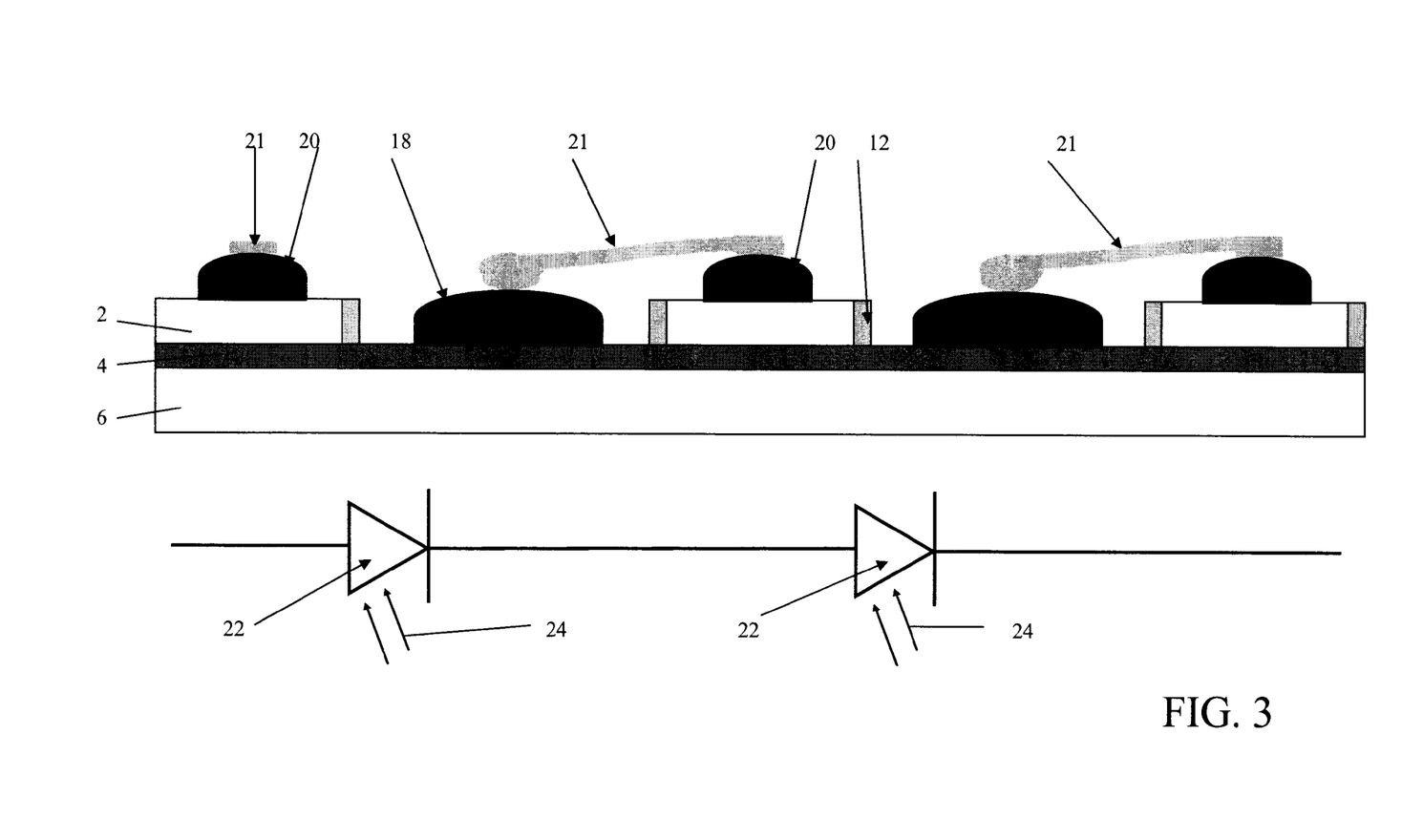
FIG. 3 schematically shows backside contacting to serialize the cells.

Serialization through back contacts is performed using printed or conventional wiring 21 as shown in FIG. 3. Also shown in FIG. 3 are the LEDs 22 and the incidence of light (arrows 24).

The serialization is realized either through printing or sputter technology. The edge contact pads are also deposited either through sputter or printing technology. Sputter is done using hard masks. Printing is preferred because it is much easier to realize and seems to have additional cost benefit.

The process depicted in FIGS. 4A to 4E is preferred for the use of scrap wafers, which are boron p-doped and can be additionally n-doped using the phosphorous thermal diffusion method.

Figure 4A:
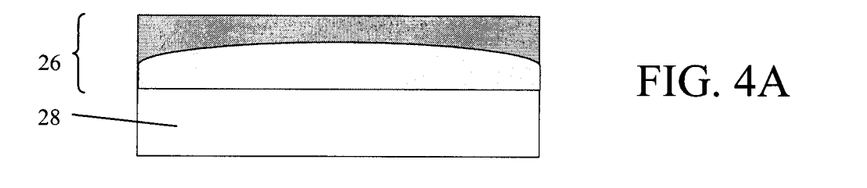
FIGS. 4A to 4E schematically depict the process flow for ultra thin Si PV cells using a single Si layer.
Figure 4B:
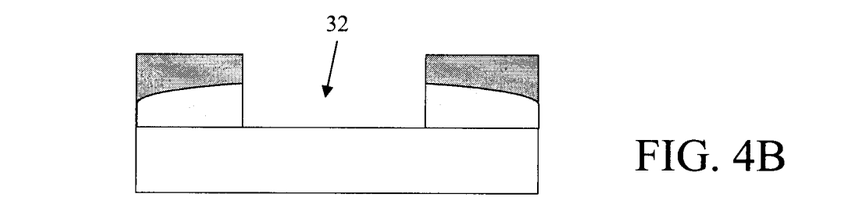
Figure 4C:
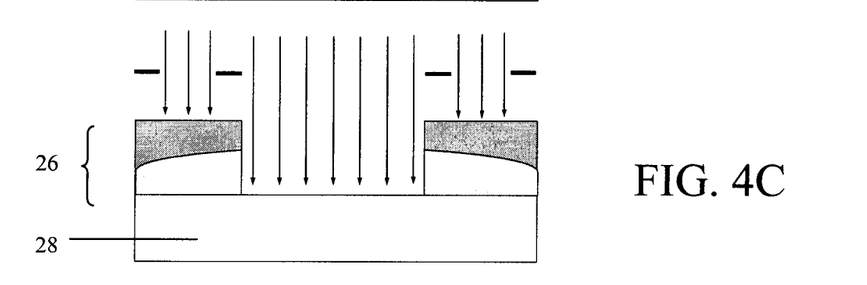
Figure 4D:
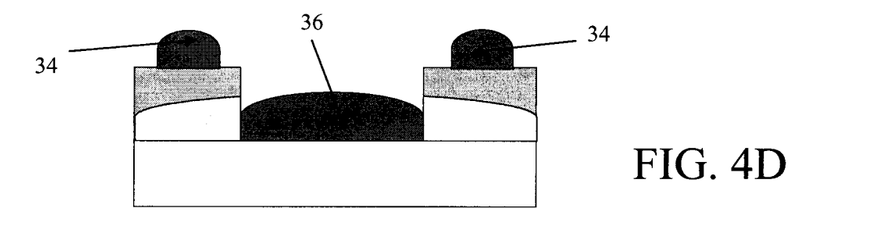
Figure 4E:
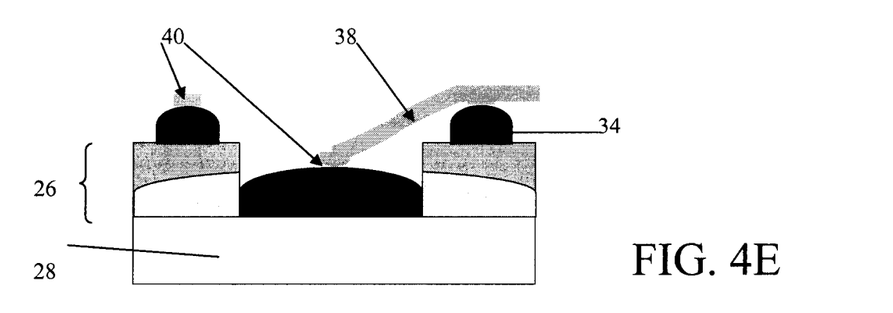

Here, in the first step, a pn-layer 26, 28 (about 3-5 μm) having an n-gradient (originating from the thermal diffusion process) is provided. The contact holes 32, which are already present on wafer level in the p-layer 26, secure the access to the n-layer 28 (cf. FIG. 4B). The contact points 34, 36 on the p- as well as on the n-layer 26, 28 are now prepared using conventional seed layer technology to place the final contact point. These are done using either standard lithography, hard mask or print technology, as has been explained in connection with FIGS. 2D and 2E. The pattern outlined above allows it to serialize the "mini" cells in one row as well as to parallelize the linked rows. The contact strips 38 and pads 40, see FIG. 4E, are made with print technology.

The cells are placed on the front glass of the module, using automated handling technique. The glass substrate can hold either 18 cells with 205×205 mm² (300 mm wafer based) or 36 cells with 140×140 mm² (200 mm wafer based).

As to light trapping, backside reflection is done through a reflection layer, e.g., Al foil layer or another metallic layer. Front side light trapping is done through an anti-reflection layer on the glass surface and reflection surface (structuring in the glass substrate, polymer coating, interference layer etc.).

The light trapping secures, that the thin silicon pn-junction has sufficient efficiency through several light paths (3-6). In case of a single light path only, the efficiency would be only at around 12-14% in case of a 4-5 μm thick active layer.

In the following, a process to build thin film cells for standardized module technology will be described.

The actual solar modules produced in the solar industry show a fairly large spread in size format. In case of the CIGS thin film technology, the production process is too complex and marginal, concerning the process window, to secure sufficient module efficiency. This would support smaller cell sizes in manufacturing, in case the cost per Watt and the cell and module wiring is resolved.

Process Description

Figure 5A:
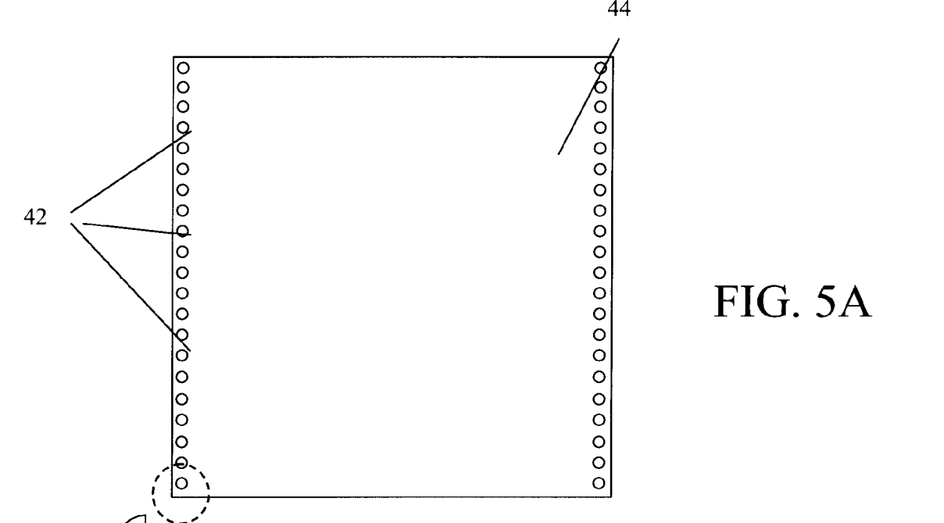
FIGS. 5A to 5D schematically show one method to realize backside connector pads for standardized module technology.
Figure 5B:
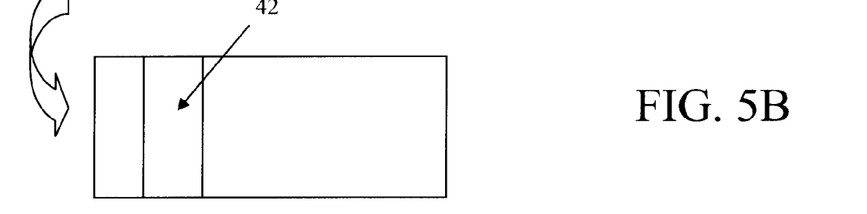
Figure 5C:
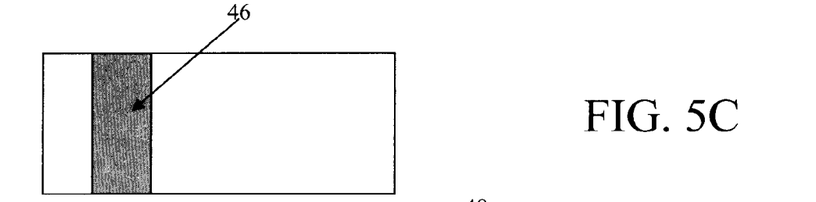
Figure 5D:
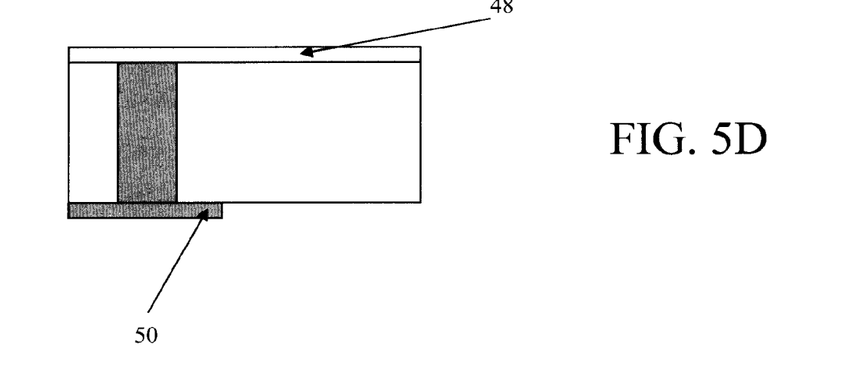

Several methods can be used to realize the backside connector pads. One is to use contact holes 42 along the glass edges of the module 44, as shown in FIG. 5A. The holes 42 are filled with contact metal 46. The next step is the molybdenum (Mo) 48 deposition on the active side of the substrate. Subsequently, the contact pads 50 (a metal pad using Al, Cu, etc. as a metal) are sputtered or printed on the backside, using hard masks to protect the remaining glass substrate surface from sputter material. The sputtered materials contact with the metal in the holes and secure backside contacts.

The contact holes in the glass substrate are filled with the metallic contact to secure the interconnection between front- and backside. Subsequently, the front- and backside are sputtered with the metallic layers which are connected through the holes. The front side is the molybdenum layer while the backside contact is deposited using hard mask or lithography technology to realize required contact strips along the cell edges.

Figure 6A:
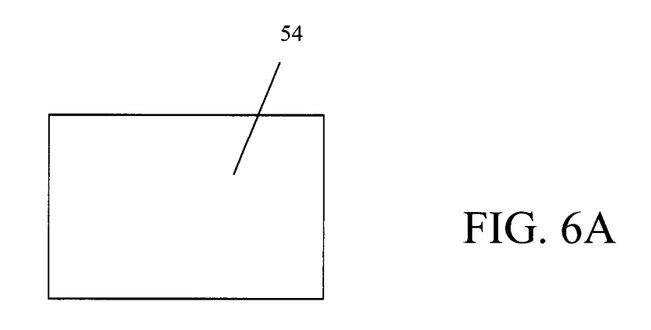
FIGS. 6A to 6C schematically depict another method to realize backside connector pads for standardized module technology.
Figure 6B:
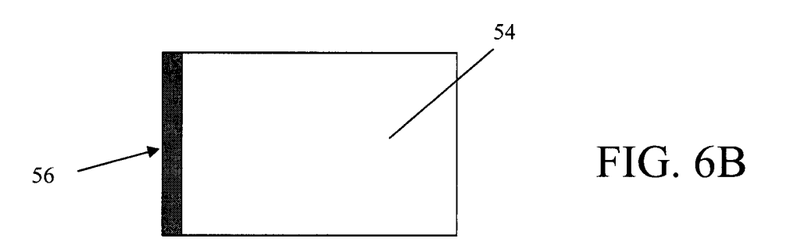
Figure 6C:
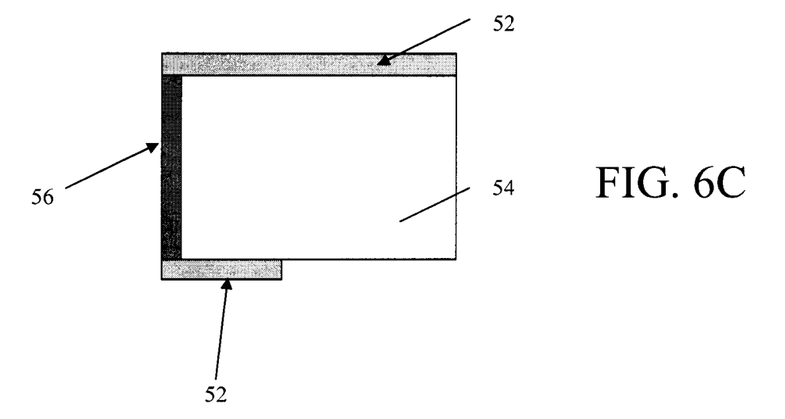

Another method to realize the backside connectivity is shown in FIGS. 6A to 6C.

The front-/backside contact is realized through metal strips 52 along the two opposite edges of the glass substrate 54. The strips are deposited either manually or using an automated glue technology of contact strips. Also it might be considered to deposit molybdenum (not shown) onto the edges using appropriate positioned sputter targets. The sputtered molybdenum layer or the metal strips 52 are connected through an edge strip 56.

Figure 7A:
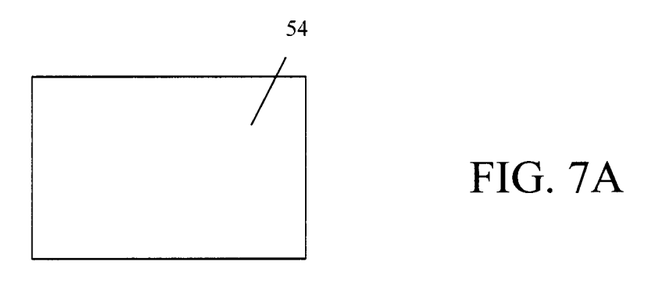
FIGS. 7A to 7C schematically show a third method to realize backside connector pads for standardized module technology.
Figure 7B:
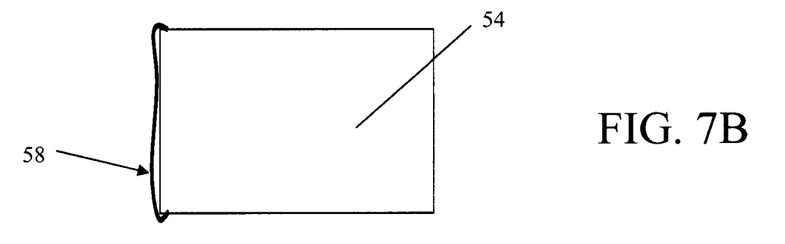
Figure 7C:
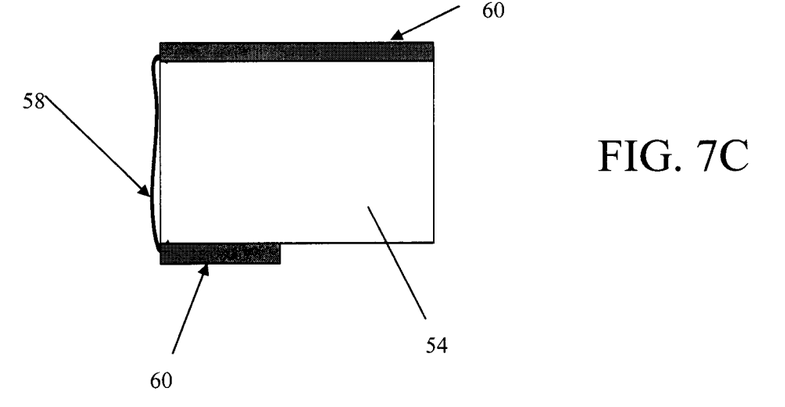

A third method using contact strips is depicted in FIGS. 7A to 7C. Here, contact strips 58 are put on the glass substrate edges before the deposition of the material 60 (metal strips of Al, Cu, etc.).

The examples listed above demonstrate various methods to realize the backside connectivity via contact pads. The method is to contact either through the glass substrate or around the glass edges to wire or connect the front contact poles (positive and negative) with the backside pads.

FIG. 8 shows the steps of the thin film cell process. The flow doesn't show the details for the active layer process, because the focus is more on the backside contact method.

Figures 8A, 8B:
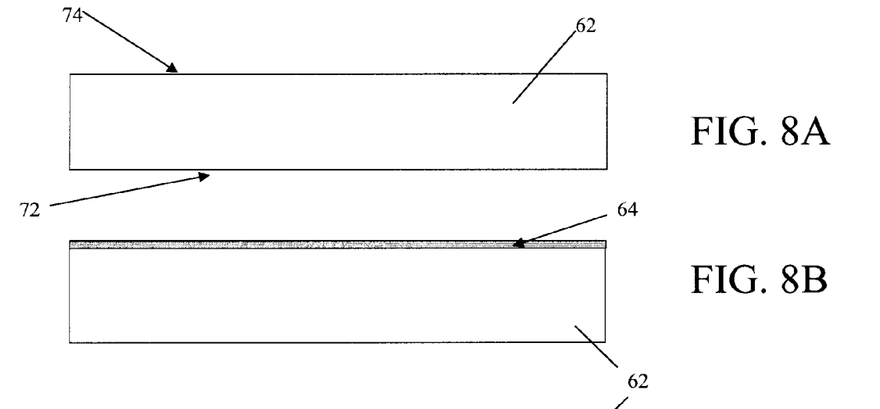
FIGS. 8A to 8E schematically depict the process flow for the connection between front and backside of a thin film cell.
Figure 8C:
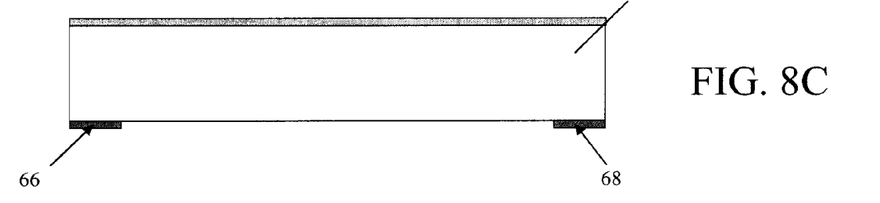
Figure 8D:
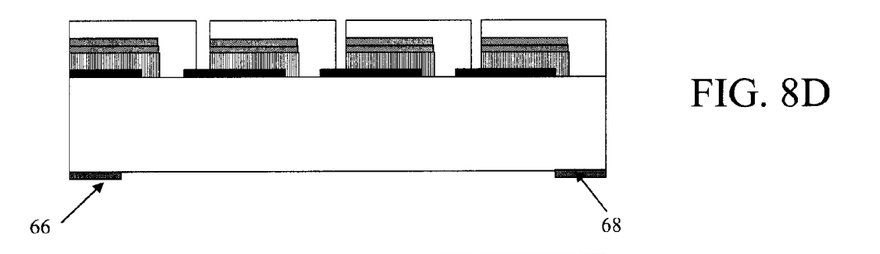
Figure 8E:
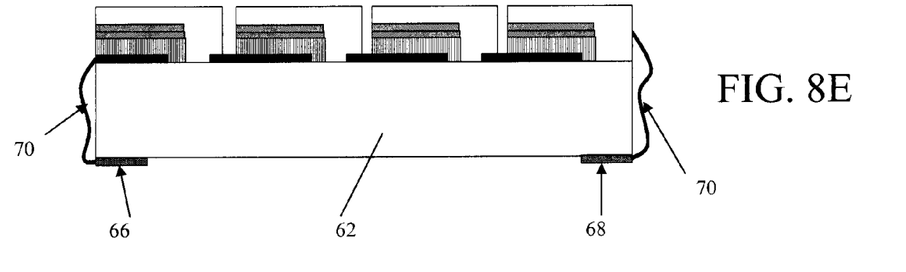

First, a glass substrate 62 is provided (FIG. 8A). A molybdenum layer 64 is then formed on the substrate (FIG. 8B). In a third step, contact pads 66, 68 are added on the backside 72 of the substrate 62 (FIG. 8C). Subsequently, the rest of the CIGS cell is finished according to known procedures (FIG. 8D, see also FIG. 10). These steps are schematically shown in the process flow in FIG. 9. Finally, wiring contact strips 70 are provided to form a connection between front side 74 and backside 72 of the cell (cf. FIGS. 7A to 7C).

Figure 9:
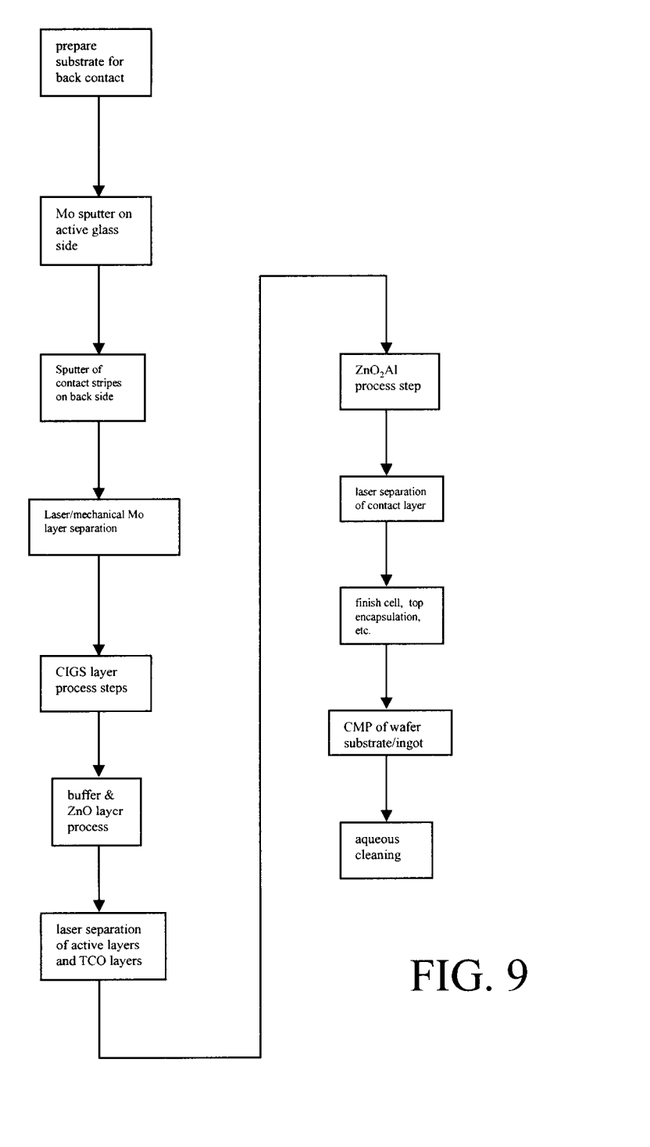
FIG. 9 schematically shows the process flow to create thin film cells on a glass substrate.
Figure 10:
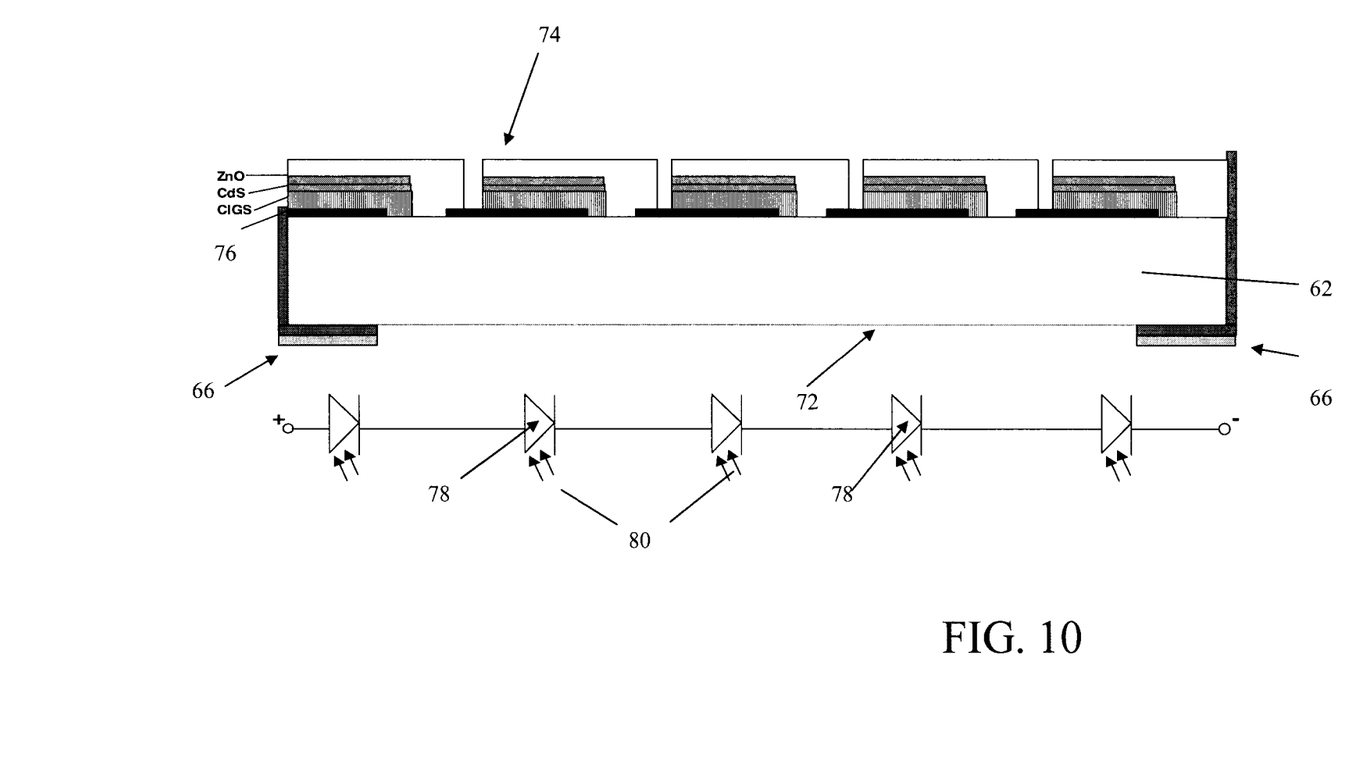
FIG. 10 schematically depicts the cell design of a standardized thin film cell.

Schematically, the process flow describing the creation of thin film cells on a glass substrate is shown in FIG. 9.

The cell design itself is made such that, e.g., at the left edge the positive pole is placed and at the right edge the negative pole is placed. All individual cells in between, realized through laser patterning, are serialized, see example above. The serialization is shown with the serialized photo diodes below the structural outline.

The positive pole on the left side is connected to the backward pad using the method described above, same for the negative pole.

FIG. 10 shows the complete cell design including the active layers.

The Mo layer 76 is the base connector for the back contact on side 72. In case of the positive pole, the Mo layer is the direct connector for the backside pad 66. In case of the negative pole, the sputtered or printed contact pad 66 is the connectivity layer for the $ZnO_2Al$ negative pole connector. Also shown in FIG. 10 are the LEDs 78 and the incidence of light (arrows 80).

The example above shows the connectivity through the glued connector bars. It would work also with the other two methods described above.

The manufactured cells ($20 \times 20$ cm$^2$) are now placed on the front glass (e.g., $60 \times 120$ cm$^2$, but can be any other size). In this case it would be 3×6 cells. The cells would be connected through the EVA foils, used for the encapsulation, which contains the wiring and contact pads, fitting to the cell pads.

The practicability of the method described above is determined by the cost per Watt. Preliminary calculations have shown that this approach is cost competitive with the module technology. Also it offers a better learning curve for further efficiency and yield improvement.

The invention claimed is:

1. A method of backside contacting ultra thin layer photovoltaic cells, comprising:
   bonding a thin film on a glass substrate creating an active side of said glass substrate;
   creating contact pads on a back-side of said glass substrate; and
   electrically connecting said thin film and said back-side,
   wherein said electrically connecting is performed by gluing metal strips along one or more edges of said glass substrate before deposition of said thin film.

2. The method according to claim 1 wherein said ultra thin layer photovoltaic cells are copper indium gallium selenide (CIGS) photovoltaic cells.

3. A method of backside contacting ultra thin layer photovoltaic cells comprising:
   bonding a thin film on a glass substrate creating an active side of said glass substrate;
   creating contact pads on a back-side of said glass substrate; and
   electrically connecting said thin film and said back side,
   wherein said electrically connecting is performed by arranging said contact pads on two opposite edges of said glass substrate and connecting said contact pads and said active side by a wired contact strip before deposition of said thin film.

4. The method according to claim 3 wherein said ultra thin photovoltaic cells are copper indium gallium selenide (CIGS) photovoltaic cells.

* * * * *